United States Patent [19]

Draeger

[11] Patent Number: 4,775,435

[45] Date of Patent: Oct. 4, 1988

[54] METHOD OF MANUFACTURING A LIQUID LEVEL PROBE

[75] Inventor: Erich Draeger, Asnieres, France

[73] Assignee: Veglia, Paris, France

[21] Appl. No.: 891,464

[22] Filed: Jul. 31, 1986

[30] Foreign Application Priority Data

Aug. 6, 1985 [FR] France ............................. 85 12021

[51] Int. Cl.[4] ...................... H01C 17/06; H01L 31/18
[52] U.S. Cl. ................................... 156/630; 156/652;
156/659.1; 427/103; 430/313; 430/318;
29/610.1; 338/15
[58] Field of Search ............... 73/304 R, 295; 338/13,
338/314, 15; 29/610; 430/313; 156/650, 652,
630; 324/106; 427/102, 103; 421/1 R

[56] References Cited

U.S. PATENT DOCUMENTS

| | | | |
|---|---|---|---|
| 3,115,423 | 12/1963 | Ashworth | 427/102 X |
| 3,370,262 | 2/1968 | Marty et al. | 338/314 X |
| 3,380,156 | 4/1968 | Lood et al. | 427/103 |
| 3,436,817 | 4/1969 | Lane | 338/13 X |
| 4,026,702 | 3/1977 | Van der Brink et al. | 338/15 |
| 4,052,901 | 10/1977 | Bjork | 73/304 R |
| 4,103,275 | 7/1978 | Diehl et al. | 335/25 |
| 4,297,392 | 10/1981 | Higashi et al. | 338/15 X |
| 4,560,642 | 12/1985 | Yonezawa et al. | 430/313 |
| 4,567,762 | 2/1986 | Hoppert et al. | 73/304 R |

FOREIGN PATENT DOCUMENTS

| | | |
|---|---|---|
| 0009252 | 9/1979 | European Pat. Off. . |
| 0085979 | 7/1983 | European Pat. Off. . |
| 0134859 | 9/1983 | European Pat. Off. . |
| 0137687 | 8/1984 | European Pat. Off. . |
| 0140747 | 5/1985 | European Pat. Off. .......... 73/304 R |

Primary Examiner—Daniel M. Yasich
Attorney, Agent, or Firm—Stevens, Davis, Miller & Mosher

[57] ABSTRACT

A probe for measuring the level of a liquid and its method of manufacture are disclosed. A conducting circuit whose resistivity depends on temperature comprises a track applied to a substrate in which is formed a window which leaves free an appreciable length of track, so that its behavior is not disturbed by the presence of the substrate. The conducting circuit is partially immersed in the liquid and the voltage at its terminals is measured when a constant current flows therethrough. The voltage measurement is representative of the level of the liquid.

1 Claim, 2 Drawing Sheets

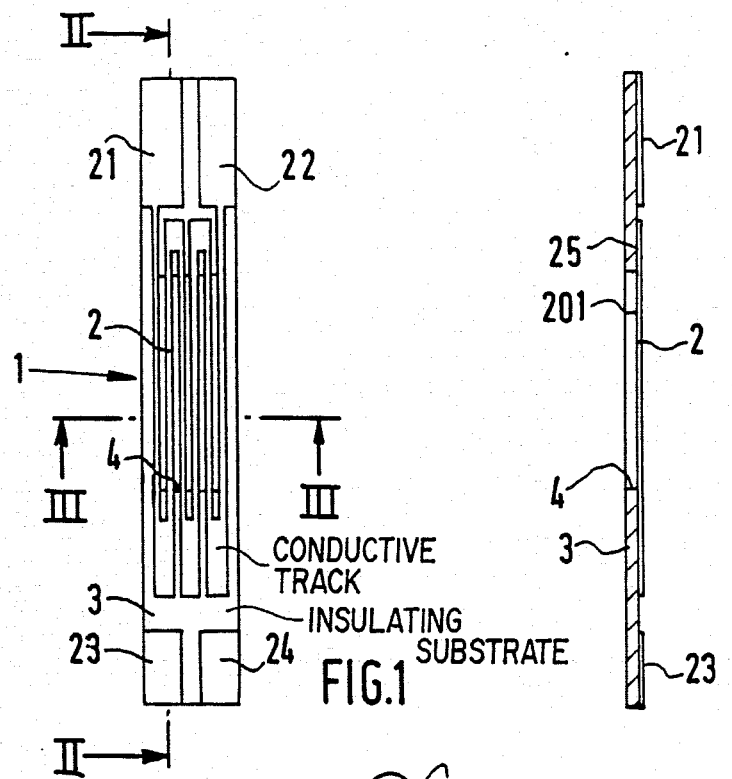
FIG.1
FIG.2
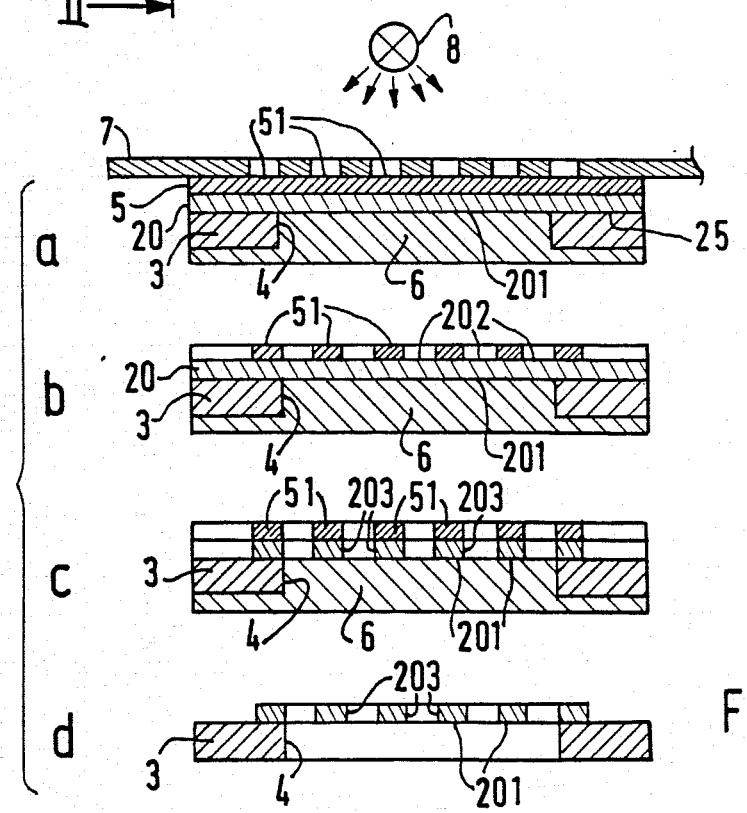
FIG.3

METHOD OF MANUFACTURING A LIQUID LEVEL PROBE

BACKGROUND OF THE INVENTION

The present invention relates to a probe for measuring the level of a liquid in a reservoir, comprising a conducting circuit and means for mounting the circuit inside the reservoir and, arranged so that the length of the circuit which is immersed in the liquid varies with the level of the liquid. the conducting circuit comprising at least one track made from a conducting material on face of which is applied to an insulating substrate and the conducting material has a resistivity which depends on the temperature.

This type of probe is already known, and is described in European patent application No. 0140747. In this known probe, the presence of the substrate forms a hindrance. In fact, the principle of a measurement is as follows. An electric current is passed through the conducting track, which heats up. The heating is different for the part of the track immersed in the liquid and for the part of the track not immersed, because of the thermal inertia of the liquid. Measurement of the total resistance, a certain time after the beginning of the current flow, gives an indication of the level of the liquid. In the probe described in the above-mentioned patent application, the time constant with which the track heats up is high, for it depends, in a rigid way, on the substrate on which the track is bonded, which may falsify the measurement if special arrangements are not made.

The present invention aims at overcoming the preceding drawback.

SUMMARY OF THE INVENTION

Thus one object of the invention is the provision of a probe of the above-defined type wherein at least one window is formed in the substrate for leaving a part of the face free.

In the probe of the invention, heating of the track in the part corresponding to the window does not depend on the substrate and may be rapid and comparable, for example, to that obtained with the probe of the so-called "hot wire" type, where a resistive wire is stretched between several supports.

The probe may then in particular be used in replacement of a probe of the "hot wire" type, without modifying the signal processing circuit disposed downstream of the probe. This forms an important advantage for the probe of the invention may be manufactured using automated methods whereas mounting a probe of the "hot wire" type must necessarily be carried out manually, which is time-consuming and expensive.

The invention also provides a method for manufacturing a conducting circuit comprising a conducting track, at least partially supported by a substrate, especially adapted for use in the above probe, in which method:

a sheet of conducting material is applied to an insulating substrate, and a film of a photosensitive material is deposited on the free face of the sheet, then certain parts of the film are exposed, and finally, the whole is subjected to the successive actions of a first, second and third compound, the first compound being chosen for dissolving the unexposed photosensitive material, the second for dissolving the conducting material and the third for dissolving the exposed photosensitive material, in which method:

before application of the conducting material sheet, the window is formed in the insulating substrate, after application of the sheet, and before being subjected to the action of the second compound, a layer of protective lacquer is applied, insoluble in the second compound and soluble in the third compound, on the free face of the substrate and on the parts of the sheet left free by the window.

BRIEF DESCRIPTION OF THE DRAWINGS

The present invention will be better understood from the following description of the preferred embodiment of the conducting circuit of the invention, as well as the preferred way of practicing the method of the invention, with reference to the accompanying drawings in which:

FIG. 1 shows a front view of the circuit of the invention,

FIG. 2 shows a profile view, in section, through line II—II of the circuit of FIG. 1, FIGS. 3a, 3b, 3c and 3b each show a view in section through line III—III of the circuit of FIG. 1 during manufacture, in four successive stages, respectively.

DESCRIPTION OF THE PREFERRED EMBODIMENT

Figure 4:
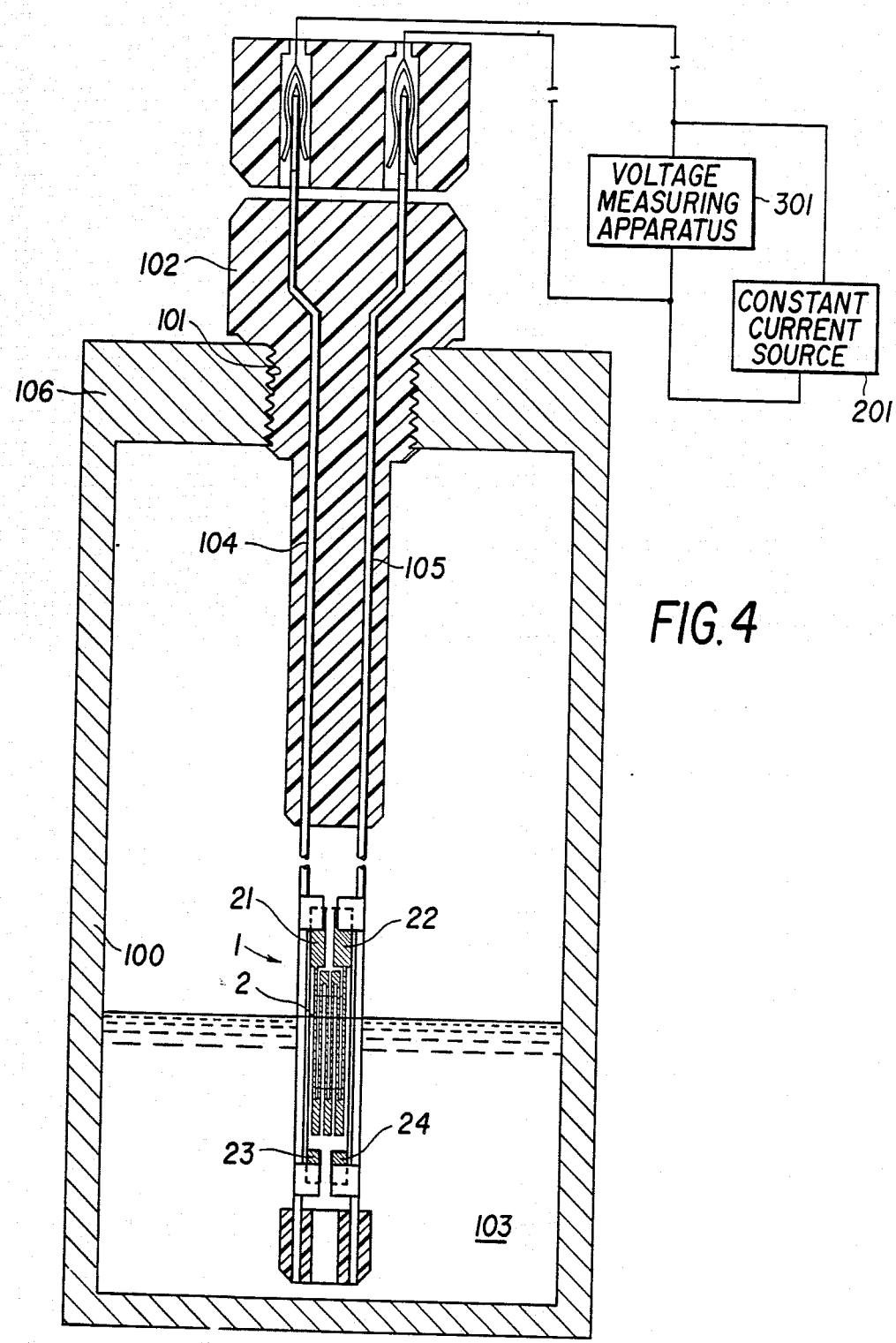
FIG. 4 shows the circuit of FIG. 7, used as a probe for measuring the level of a liquid in a reservoir.

A conducting circuit 1, intended here to be used as a probe for measuring the oil level in the crank-case of a motor vehicle, comprises a track 2 made from a conducting material, with preferably an alloy of 54% iron, 29% nickel and 17% cobalt, whose face 25 (not visible in FIG. 1) is adhered to an insulating substrate 3, preferably of Kapton.

Track 2 here comprises six parallel rectilinear segments, whose ends are connected to twos so as to form a continuous path, zig-zagging between two access studs 21 and 22, close to the upper end in FIGS. 1 and 2, of circuit 1 and connected to the two end segments of track 2. Two fixing studs 23 and 24, similar to the access studs 21 and 22, but not connected to track 2, are adjacent the lower end of circuit 1.

The substrate comprises a window 4, here rectangular, under track 2, so as to leave free the part 201 of the face 25 of the track 2 which corresponds here to substantially the whole of the four central segments. The remaining part of face 25 of track 2, which corresponds among other things to the ends of the four central segments, remains adhered to substrate 3 and so integral therewith in the vicinity of the two opposite lateral edges of window 4.

The circuit which has just been described is used in the following way, referring to FIG. 4.

Studs 21 and 23 on the one hand and 22 and 24 on the other are soldered to a first 104 and a second 105 perfectly conducting metal rods, secured to an insulating cap 102 which may fit on to an opening 101 formed in the upper horizontal wall 106 of the crank-case 100 of the motor vehicle. The assembly allows the circuit to be mounted vertically inside the crank-case 100, so that each of the six segments of track 2 is partially immersed in the oil 103, the total immersed length of track 2 being variable with the level of the oil 103 in the crank-case 100. With the probe thus mounted, a constant current, produced by constant current source 207," is caused to flow through the circuit formed by the metal rods 104 and 105 and track 2. Under the action of this current, track 2 warms up. However, since the immersed part of track 2 is cooled by the oil 103, whereas the non immersed part is not, each of these parts assumes a different temperature. Since the iron, nickel and cobalt alloy in which track 2 is formed is made from a material whose resistivity depends greatly on the temperature, the total resistance of track 2 depends greatly on the temperature of its different parts, so on the level of the oil 103 in the crank-case 100. Using voltage measuring apparatus 301, a measurement of voltage developed between the two perfectly conducting metal rods 104 and 105 gives an indication about the value of the total resistance of track 2 (since the assembly has a constant current flowing therethrough), and so about the level of the oil 103.

In such a probe, the temperature behavior of the track is practically identical to that of a wire of the same material stretched in the air, for the track is almost everywhere free, that is to say without contact with the substrate. Thus, the non immersed part of the track may heat up rapidly for the portions secured to the substrate, whose thermal inertia is higher, and which are only useful for mechanically holding the track in position, may be of very small length.

Naturally, this is not absolutely necessary and if, for a particular reason, it is desired that the thermal inertia of the track be situated at a value intermediate between that of the free track and that of the track entirely applied to the substrate, particular window arrangements may be provided for making one segment out of two or one of three free for example.

The iron, nickel and cobalt alloy in which track 2 is formed may be replaced by any conducting material whose resistivity depends greatly on the temperature, and in particular any other alloy or pure metal having this property.

The foregoing description relates to a probe for measuring the level of oil, but it is obviously possible to use a circuit of the invention for different applications, in particular for microwave applications. In this case, a perfectly conducting material is used for forming a track of constant width comprising a rectilinear segment, only the ends of which are secured to the substrate, and whose major part is left free by a window. The face of the substrate, opposite that on which the track is applied, is placed in a perfectly conducting plane. The track segment then forms, with a perfectly conducting plane, a line portion of the type known under the names of "microstrip" whose dielectric, preferably air, is perfectly homogeneous. The circuit of the invention may be formed by the method which will now be described, with reference to FIG. 3. A sheet 20 of the conducting material in which track 2 will be formed is applied to the insulating substrate 3, in which the window 4 has been formed.

A film 5 of a photosensitive material is deposited on the free face of sheet 20 and a layer 6 of protective lacquer is applied to the free face of substrate 3 and to the part 201 of face 25 of sheet 20 left free by the window 4.

By means of a mask 7 and a light source 8, some parts 51 of the film 5 are exposed (FIG. 3a), which are polymerized under the action of the light.

Mask 7 is removed and, by means of a first compound, trichloroethylene in this case, the non polymerized parts of film 5 are dissolved in a way known per se. Only parts 51 then remain on sheet 20 (FIG. 3b).

Using a second compound, a mixture of perchloride and nitric acid for example, and in a way known per se, the parts 202 of sheet 20 not protected by the parts 51 of film 5 are dissolved. Only the parts 203, which have been protected by the parts 51 of film 5, then remain on substrate 3 (FIG. 3c).

With a third compound, methylene chloride diluted with alcohol for example, and in a known way, the parts 51 and the protective lacquer layer 6 are dissolved, so that only the parts 203 remain (FIG. 3d).

The photosensitive material forming film 5, the portective lacquer forming layer 6 and the three compounds must be chosen in relation with each other.

Thus, in the preceding example, the unexposed photosensitive material must be soluble in trichloroethylene. When it has been exposed, it must be insoluble in the perchloride and nitric acid mixture and soluble in the methylene chloride diluted with alcohol.

Similarly, the protective lacquer must be insoluble in trichlorethylene and the perchloride and nitric acid mixture but soluble in the methylene chloride diluted with alcohol.

It is also possible to use a protective lacquer soluble in trichlorethylene, providing that layer 6 is applied after the unexposed parts of film 5 have been dissolved with trichlorethylene.

What is claimed is:

1. A method for manufacturing a conducting circuit comprising a conducting track, at least partially supported by a substrate, comprising the steps of:
    (a) forming a window in a substrate;
    (b) adhering a sheet of conducting material to said substrate, one face of said sheet and one face of said substrate being left free, and a part of the other face of said sheet being left free by said window;
    (c) depositing a film of photosensitive material on said free face of said sheet;
    (d) coating a layer of protective lacquer on said free face of said substrate and on said part of said other face of said sheet left free by said window;
    (e) exposing parts of said film corresponding to a pattern of said conducting track to provide exposed parts and unexposed parts of said film;
    (f) dissolving, by a first compound, said unexposed parts of said film, said unexposed parts being soluble in said first compound and said exposed parts being insoluble in said first compound to provide protected parts of said sheet underlying said exposed parts of said film and non-protected parts of said sheet at other parts of said sheet, said protected parts corresponding to said pattern of said conducting track; and,
    (g) selectively dissolving, by a second compound, said non-protected parts of said sheet, without dissolving said exposed parts of said photosensitive film and said protected parts of said sheet,
    (h) dissolving, by a third compound, said exposed parts of said film and said layer of protective lacquer, said exposed parts and said layer of lacquer being soluble in said third compound and said substrate and said protected parts being insoluble in said third compound, whereby said conducting track is provided by said protected pairs of said sheet of conducting material adhered to said substrate.

* * * * *